(12) United States Patent
Sun (10) Patent No.: US 11,997,871 B2
(45) Date of Patent: May 28, 2024

(54) ORGANIC LIGHT-EMITTING DIODE DISPLAY PANEL, METHOD FOR PREPARING THE SAME, AND DISPLAY DEVICE

(71) Applicant: BOE Technology Group Co., Ltd., Beijing (CN)

(72) Inventor: Haiyan Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/733,289

(22) Filed: Apr. 29, 2022

(65) Prior Publication Data

US 2022/0263052 A1 Aug. 18, 2022

Related U.S. Application Data

(63) Continuation of application No. 16/516,894, filed on Jul. 19, 2019, now abandoned.

(30) Foreign Application Priority Data

Dec. 10, 2018 (CN) .......................... 201811503645.1

(51) Int. Cl.
*H10K 50/856* (2023.01)
*H10K 50/844* (2023.01)
(Continued)

(52) U.S. Cl.
CPC ......... *H10K 50/856* (2023.02); *H10K 50/844* (2023.02); *H10K 50/85* (2023.02);
(Continued)

(58) Field of Classification Search
CPC .... H10K 50/856; H10K 50/844; H10K 50/85; H10K 50/858; H10K 71/00
See application file for complete search history.

(56) References Cited

U.S. PATENT DOCUMENTS 7,599,117 B2 * 10/2009 Goto ................. G02F 1/133526
359/453
7,686,463 B2 * 3/2010 Goto ................. G02F 1/133524
359/613

(Continued)

FOREIGN PATENT DOCUMENTS

| CN | 1806187 A | 7/2006 |
|---|---|---|
| CN | 107808934 A | 3/2018 |
| TW | 201226997 A | 7/2012 |

OTHER PUBLICATIONS

Office Action of CN Application No. 201811503645.1 and English translation, dated May 22, 2020, 18 pages.

(Continued)

*Primary Examiner* — Bilkis Jahan
*Assistant Examiner* — Victor V Barzykin
(74) *Attorney, Agent, or Firm* — Muncy, Geissler, Olds & Lowe, P.C.

(57) ABSTRACT

The present disclosure provides an organic light-emitting diode display panel, a method for preparing the same, and a display device. The organic light-emitting diode display panel includes a substrate, a light-emitting structure layer arranged on the substrate, and a light modulation layer arranged on a light exiting path of the light-emitting structure layer and configured to adjust a direction of an emergent light beam.

20 Claims, 6 Drawing Sheets

(51) Int. Cl.
*H10K 50/85* (2023.01)
*H10K 50/858* (2023.01)
*H10K 71/00* (2023.01)
*H10K 59/35* (2023.01)

(52) U.S. Cl.
CPC .......... *H10K 50/858* (2023.02); *H10K 71/00* (2023.02); *H10K 59/351* (2023.02)

(56) References Cited

U.S. PATENT DOCUMENTS

| | | | |
|---|---|---|---|
| 8,921,840 B2 * | 12/2014 | Kim | H10K 50/865 |
| | | | 257/40 |
| 10,050,236 B2 | 8/2018 | Chen et al. | |
| 2002/0084952 A1 * | 7/2002 | Morley | H10K 59/30 |
| | | | 345/32 |
| 2003/0164679 A1 * | 9/2003 | Hamano | H10K 50/858 |
| | | | 313/504 |
| 2004/0217702 A1 * | 11/2004 | Garner | H10K 50/858 |
| | | | 445/24 |
| 2006/0245060 A1 * | 11/2006 | Goto | G02F 1/133524 |
| | | | 359/613 |
| 2007/0153377 A1 * | 7/2007 | Goto | G02F 1/133524 |
| | | | 359/460 |
| 2008/0079355 A1 | 4/2008 | Smith | |
| 2011/0147777 A1 | 6/2011 | Konno et al. | |
| 2015/0041779 A1 * | 2/2015 | Park | H10K 50/858 |
| | | | 362/326 |
| 2015/0076457 A1 | 3/2015 | Kwon et al. | |
| 2015/0102327 A1 | 4/2015 | Kim et al. | |
| 2016/0087245 A1 | 3/2016 | Park et al. | |
| 2018/0226616 A1 | 8/2018 | Zhang et al. | |
| 2020/0144550 A1 | 5/2020 | Lee | |
| 2020/0303466 A1 | 9/2020 | Park et al. | |

OTHER PUBLICATIONS

Office Action of CN Application No. 201811503645.1 and English translation, dated Sep. 11, 2020, 14 pages.
Office Action of CN Application No. 201811503645.1 and English translation, dated Apr. 15, 2021, 10 pages.
Final Office Action of parent U.S. Appl. No. 16/516,894, dated Apr. 28, 2021, 8 pages.
Office Action of parent U.S. Appl. No. 16/516,894, dated Feb. 4, 2022, 8 pages.
Office Action of parent U.S. Appl. No. 16/516,894, dated Jul. 22, 2021, 9 pages.
Office Action of parent U.S. Appl. No. 16/516,894, dated Oct. 6, 2020, 12 pages.
Office Action of parent U.S. Appl. No. 16/516,894, dated Jun. 25, 2020, 6 pages.

* cited by examiner

ORGANIC LIGHT-EMITTING DIODE DISPLAY PANEL, METHOD FOR PREPARING THE SAME, AND DISPLAY DEVICE

CROSS-REFERENCE TO RELATED APPLICATION

This application is a continuation application of U.S. application Ser. No. 16/516,894, filed on Jul. 19, 2019, which claims a priority to Chinese Patent Application No. 201811503645.1 filed on Dec. 10, 2018, the disclosures of which are incorporated in their entirety by reference herein.

TECHNICAL FIELD

The present disclosure relates to the field of display technology, in particular to an organic light-emitting diode display panel and a method for preparing the same, and a display device including the display panel.

BACKGROUND

The organic light-emitting diode (OLED) display panel is an active light-emitting display device, which has the advantages of self-illumination, wide viewing angle, high contrast, full color display, light weight, thin thickness, low power consumption, high reaction speed, etc., and which can achieve flexible display, and is the most promising display device.

The OLED display panel can be classified into a bottom emitting OLED and a top emitting OLED according to the position of the light emitting. Due to the low aperture ratio of the bottom emitting OLED, the current OLED display panel is usually of the top emitting OLED structure.

The main structure of the light-emitting unit in the OLED display panel includes a first electrode, a second electrode, and an organic electroluminescent structure layer arranged between the first electrode and the second electrode. In order to form a microcavity effect, generally, the first electrode is a total reflection electrode, and the second electrode is a transmissive electrode or a transflective electrode. The microcavity effect is capable of producing strong multi-beam interference, which has the effect of selecting, narrowing and strengthening the light source, so that the beam of front viewing angle is enhanced and the chromaticity is purified. However, the actual use shows that the microcavity effect has a problem of characteristic deviation of viewing angle. The characteristic deviation of viewing angle indicates that the brightness and chromaticity of the emergent light beam gradually decrease as the viewing angle increases, in which the brightness and chromaticity of the front viewing angle are the highest, and the brightness and chromaticity of the large viewing angle are low.

Therefore, how to solve the problem of characteristic deviation of viewing angle in the related technology is a technical problem to be solved in the field.

SUMMARY

The technical problem to be solved by the present disclosure is to provide an OLED display panel, a method for preparing the same, and a display device including the OLED display panel, to solve the problem of characteristic deviation of viewing angle in the related art.

In order to solve the above problem, an embodiment of the present disclosure provides an organic light-emitting diode display panel, including a substrate, a light-emitting structure layer arranged on the substrate, and a light modulation layer arranged on a light exiting path of the light-emitting structure layer and configured to adjust a direction of an emergent light beam.

In an example, An organic light-emitting diode (OLED) display panel, comprising a substrate, a light-emitting structure layer arranged on the substrate, and a light modulation layer arranged on a light exiting path of the light-emitting structure layer and configured to adjust a direction of an emergent light beam, wherein the light modulation layer is configured to totally reflect a part of a front viewing-angle emergent light beam from the light-emitting structure layer to change it into a large viewing-angle emergent light beam, and/or to refract a part of a large viewing-angle emergent light beam from the light-emitting structure layer to change it into a front viewing-angle emergent light beam, in which the light modulation layer comprises a first structural layer and a second structural layer which are stacked, with the first structural layer having a first refractive index, and the second structural layer having a second refractive index less than the first refractive index, in which a plurality of strip protrusions is provided on a surface of the first structural layer facing the second structural layer; and a plurality of strip grooves is provided on a surface of the second structural layer facing the first structural layer, with the plurality of strip grooves on the second structural layer being attached to the plurality of strip protrusions on the first structural layer; and/or wherein a plurality of block protrusions is provided on a surface of the first structural layer facing the second structural layer; and a plurality of block grooves is provided on a surface of the second structural layer facing the first structural layer, with the plurality of block grooves on the second structural layer being attached to the plurality of block protrusions on the first structural layer, in which the plurality of strip protrusions and the plurality of strip grooves have a trapezoid-like shape in a cross section perpendicular to the substrate, the plurality of block protrusions and the plurality of block grooves have a trapezoid-like shape in a cross section perpendicular to the substrate, and two lateral sides of the trapezoid-like shape are of a fold line shape such that the lateral sides of the trapezoid-like shape have at least two slope angles.

In an example, a thickness of the first structural layer in a direction perpendicular to the substrate is greater than a thickness of the strip protrusions in a direction perpendicular to the substrate, and a thickness of the first structural layer in a direction perpendicular to the substrate is greater than a thickness of the block protrusions in a direction perpendicular to the substrate.

In an example, the first structural layer consists of one first plane layer and the plurality of strip protrusions, the second structural layer consists of one second plane layer and the plurality of strip grooves, a thickness of the strip protrusions in a direction perpendicular to the substrate is greater than a thickness of the first plane layer in a direction perpendicular to the substrate, and a thickness of the strip grooves in a direction perpendicular to the substrate is greater than a thickness of the second plane layer in a direction perpendicular to the substrate.

In an example, orthographic projections of both the block protrusions and the block grooves on the substrate are rectangular.

In an example, two lateral sides of the trapezoid-like shape are curved or arcuate.

In an example, the strip protrusions and the strip grooves have a semicircle or semielliptic shape, rectangle-like shape or triangle-like shape in the cross section perpendicular to the substrate.

In an example, the light modulation layer is configured to totally reflect a part of a front viewing-angle emergent light beam from the light-emitting structure layer to change it into a large viewing-angle emergent light beam, and to refract a part of a large viewing-angle emergent light beam from the light-emitting structure layer to change it into a front viewing-angle emergent light beam, so as to redistribute the front viewing-angle emergent light beam and the large viewing-angle emergent light beam, in which a viewing angle is an angle between a normal direction of a display plane and a line of sight, the front viewing-angle emergent light beam is an emergent light beam having a viewing-angle in the range of 0° to 15°, and the large viewing-angle emergent light beam is an emergent light beam having a viewing-angle greater than 40°.

In an example, the light modulation layer is located on a side of the light-emitting structure layer away from the substrate.

In an example, the OLED display panel further includes: a protective layer arranged on a side of the light-emitting structure layer away from the substrate which is also a side of the light modulation layer proximate to the substrate; and a packaging layer arranged on a side of the light-emitting structure layer away from the substrate.

In an example, the light modulation layer includes a first structural layer and a second structural layer which are stacked, with the first structural layer having a first refractive index, and the second structural layer having a second refractive index less than the first refractive index.

In an example, a plurality of strip protrusions is provided on a surface of the first structural layer facing the second structural layer; and a plurality of strip grooves is provided on a surface of the second structural layer facing the first structural layer, with the plurality of strip grooves on the second structural layer being attached to the plurality of strip protrusions on the first structural layer, and with each pair of the plurality of strip protrusions and the plurality of strip grooves having the same shape of trapezoid in a cross section perpendicular to the substrate and parallel to a length direction of the substrate.

In an example, a plurality of block protrusions is provided on a surface of the first structural layer facing the second structural layer; and a plurality of block grooves is provided on a surface of the second structural layer facing the first structural layer, with the plurality of block grooves on the second structural layer being attached to the plurality of block protrusions on the first structural layer, and with each pair of the plurality of block protrusions and the plurality of block grooves having the same shape of trapezoid in a cross section perpendicular to the substrate and parallel to a length direction of the substrate.

In an example, an angle θ between a lateral side and a lower side of the trapezoid is greater than or equal to 55° and less than or equal to 90°.

In an example, a height of the trapezoid is equal to a thickness of the first structural layer or the second structural layer, and a pitch between the plurality of strip protrusions or the plurality of block protrusions is zero.

In an example, a lateral side of the trapezoid is linear, curved or arcuate.

In an example, a material of the first structural layer includes at least one of zirconium oxide and titanium oxide, and has a first refractive index being greater than or equal to 1.8; and a material of the second structural layer includes at least one of silicon oxide, silicon nitride and fluoropolymer, and has a second refractive index being less than or equal to 1.5.

In an example, the light-emitting structure layer includes a first light-emitting unit, a second light-emitting unit, and a third light-emitting unit periodically arranged on the substrate.

An embodiment of present disclosure also provides a display device including the above-mentioned organic light-emitting diode display panel.

In order to solve the above technical problem, an embodiment of the present disclosure further provides a method for preparing an organic light-emitting diode display panel, including: forming a light-emitting structure layer on the substrate; and forming a light modulation layer on a light exiting path of the light-emitting structure layer, with the light modulation layer being configured to adjust a direction of an emergent light beam.

In an example, the light modulation layer is formed on a side of the light-emitting structure layer away from the substrate, and the method further includes: forming a protective layer on a side of the light-emitting structure layer away from the substrate which is also a side of the light modulation layer proximate to the substrate; and forming a packaging layer on a side of the light-emitting structure layer away from the substrate.

In an example, the forming the light modulation layer includes: depositing a first structural thin film, and forming a first structural layer having a plurality of strip protrusions or block protrusions on a surface thereof by a patterning process; and depositing or coating a second structural thin film on the first structural layer, to form a second structural layer filling a recessed space between the plurality of strip protrusions or a recessed space between the plurality of block protrusions.

In an example, a material of the first structural layer includes at least one of zirconium oxide and titanium oxide, and has a first refractive index greater than or equal to 1.8; and a material of the second structural layer includes at least one of silicon oxide, silicon nitride and fluoropolymer, and has a second refractive index less than or equal to 1.5.

BRIEF DESCRIPTION OF THE DRAWINGS

The drawings described herein are intended to provide a further understanding of the technical solutions of the present disclosure, and constitute a part of this disclosure. They together with the embodiments of the present disclosure are intended to illustrate the technical solutions of the present disclosure, and do not constitute a limitation of the technical solutions of the present disclosure. The shapes and sizes of the various components in the drawings do not reflect true proportions, but are merely intended to illustrate the present disclosure.

DETAILED DESCRIPTION

The detailed description of the present disclosure will be further described in detail below with reference to the drawings and examples. The following examples are used to illustrate the disclosure, but are not intended to limit the scope of the disclosure. It should be noted that the embodiments in the disclosure and the features in the embodiments can be arbitrarily combined with each other, as long as they contradict each other.

According to the study by the inventors of the present disclosure, the resson of the characteristic deviation of viewing angle caused by the microcavity effect is that due to the interference selectivity of each film layer in the light-emitting unit, the color and intensity of the emergent light beam of the film layer will be adjusted according to the thickness of each film layer, and the path (i.e., the optical path) through which the large viewing-angle emergent light beam passes is different from the path through which the front viewing-angle emergent light beam passes, so that the brightness and chromaticity of the large viewing-angle emergent light beam is low, resulting in a problem of the characteristic deviation of viewing angle. To this end, embodiments of the present disclosure provides an OLED display panel, a method for preparing the same, and a display device including the OLED display panel. According to embodiments of the present disclosure, the direction of the emergent light beam is adjusted, such that the front viewing-angle emergent light beam and the large viewing-angle emergent light beam are redistributed, to balance the brightness and chromaticity between the large viewing angle and the large viewing angle, to effectively solve the problem of characteristic deviation of viewing angle in the related art.

An OLED display panel according to an embodiment of the present disclosure includes: a substrate, a light-emitting structure layer arranged on the substrate, and a light modulation layer arranged on a light exiting path of the light-emitting structure layer, in which the light modulation layer is configured to adjust the direction of the emergent light beam.

According to an OLED display panel provided by an embodiment of the present disclosure, the light modulation layer is arranged on the light exiting path of the light-emitting structure layer, in which the light modulation layer is configured to adjust the direction of the emergent light beam to redistribute the front viewing-angle emergent light beam and the large viewing-angle emergent light beam, to effectively solve the problem of characteristic deviation of viewing angle in the related art and improve display quality.

The technical solutions of the embodiments of the present disclosure will be described in detail below by means of specific embodiments.

Figure 1:
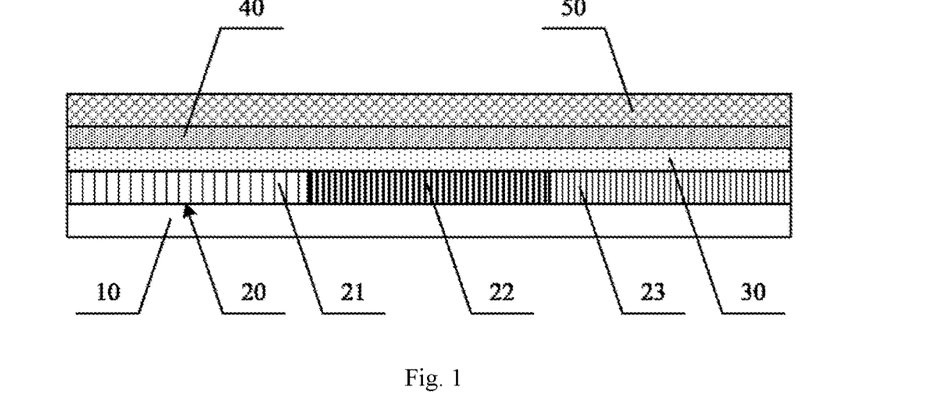
FIG. 1 is a schematic view showing an OLED display panel according to some embodiments of the present disclosure.

FIG. 1 is a schematic view showing an OLED display panel according to some embodiments of the present disclosure. As shown in FIG. 1, the OLED display panel of this embodiment includes: a substrate 10; a light-emitting structure layer 20 arranged on the substrate 10, in which the light-emitting structure layer 20 includes a first light-emitting unit 21, a second light-emitting unit 22, and a third light-emitting unit 23 periodically arranged, and the first light-emitting unit 21, the second light-emitting unit 22 and the third light-emitting unit 23 are capable of emitting light under the driving of the substrate 10; a protective layer 30 arranged on the light-emitting structure layer 20; a light modulation layer 40 arranged on the protective layer 30, in which the light modulation layer 40 is configured to adjust the directions of emergent light beams from the first light-emitting unit 21, the second light-emitting unit 22, and the third light-emitting unit 23; and a packaging layer 50 arranged on a side of the light modulation layer 40 away from the substrate.

In this embodiment, the display panel includes a plurality of pixel units arranged in a matrix, and each of the plurality of pixel units includes at least three sub-pixels. In the structure shown in FIG. 1, one pixel unit includes three sub-pixels, that is, a first light-emitting unit 21, a second light-emitting unit 22 and a third light-emitting unit 23 in the light-emitting structure layer 20. These three light-emitting units respectively are a red light-emitting unit, a green light-emitting unit and a blue light-emitting unit, to form a red sub-pixel R, a green sub-pixel G, and a blue sub-pixel B, respectively. Of course, the solution of the embodiment of the present disclosure is also applicable to a case where one pixel unit includes four sub-pixels (i.e. a red sub-pixel R, a green sub-pixel G, a blue sub-pixel B, and a white sub-pixel W). In this embodiment, the substrate 10 includes a driving circuit, and each of the light-emitting units includes a first electrode, an organic electroluminescence layer and a second electrode, in which the organic electroluminescent layer is arranged between the first electrode and the second electrode, includes an organic light-emitting layer, and is capable of emitting light of a set color under the driving by an electric field between the first electrode and the second electrode. One electrode of the first electrode and the second electrode is a reflective electrode, and the other electrode is a transmissive electrode or a transflective electrode. In this embodiment, the protective layer 30 is used to protect each of the light-emitting units.

In this embodiment, the light modulation layer 40 has a characteristic of totally reflecting and refracting the emergent light beam, so that a part of the front viewing-angle emergent light beam from the light-emitting structure layer 20 is totally reflected and changed into a large viewing-angle emergent light beam, and a part of the large viewing-angle emergent light beam from the light-emitting structure layer 20 is refracted and changed into a front viewing-angle emergent light beam, so as to adjust the direction of the emergent light beam from the light-emitting unit, to redistribute the front viewing-angle emergent light beam and the large viewing-angle emergent light beam, so as to balance the brightness and chromaticity of the front viewing-angle emergent light beam and the large viewing-angle emergent light beam, and eliminate the characteristic deviation of viewing angle.

Figure 2:
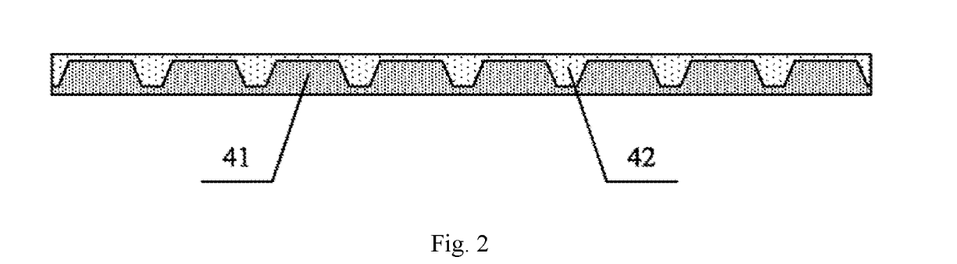
FIG. 2 is a schematic cross-sectional view showing a structure of a light modulation layer of an OLED display panel according to some embodiments of the present disclosure.

FIG. 2 is a schematic cross-sectional view showing a structure of a light modulation layer of an OLED display panel according to some embodiments of the present disclosure. As shown in FIG. 2, the light modulation layer of this embodiment includes a first structural layer 41 and a second structural layer 42 which are stacked, in which the first structural layer 41 has a first refractive index n1 and the second structural layer 42 has a second refractive index n2, with n1>n2.

Figure 3:
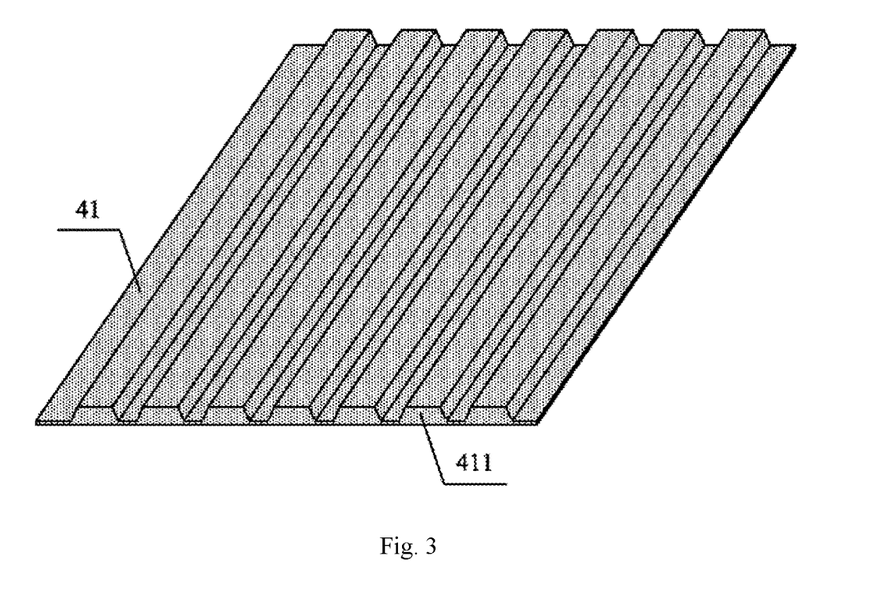
FIG. 3 is a schematic perspective view showing a structure of a first structural layer of an OLED display panel according to some embodiments of the present disclosure.
Figure 4:
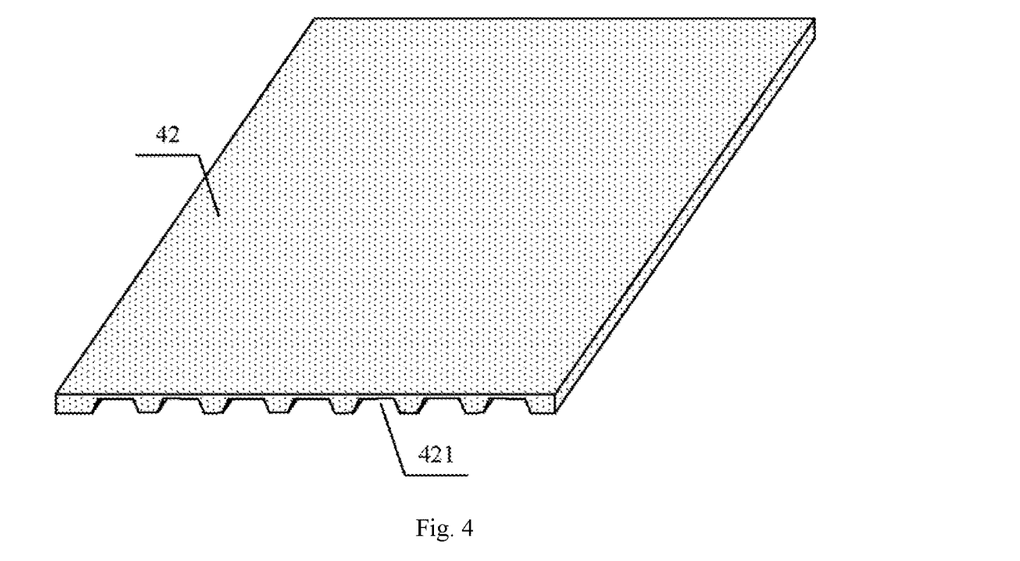
FIG. 4 is a schematic perspective view showing a structure of a second structural layer of an OLED display panel according to some embodiments of the present disclosure.

FIG. 3 is a schematic perspective view showing a structure of a first structural layer of an OLED display panel according to some embodiments of the present disclosure. FIG. 4 is a schematic perspective view showing a structure of a second structural layer of an OLED display panel according to some embodiments of the present disclosure. As shown in FIG. 3, the first structural layer 41 is a plate structure, on the surface (upper surface) of which facing the second structural layer 42 a plurality of strip projections 411 is sequentially arranged. As shown in FIG. 4, the second structural layer 42 is a plate structure, on the surface (lower surface) of which facing the second structural layer 41 a plurality of strip grooves 421 is sequentially arranged. In the structure shown in FIGS. 3 and 4, the strip protrusions 411 and the strip grooves 421 are same in the cross-sectional shape in a plane perpendicular to the substrate and parallel to the longitudinal direction of the substrate, are same in their arrangement, the arrangement pitch and the like parameters, so that when the second structural layer 42 is arranged on the first structural layer 41, the plurality of strip grooves 421 on the second structural layer 42 is closely attached or buckled with the plurality of strip protrusions 411 on the first structural layer 41, thereby forming a light modulation structure in which a material having a high refractive index and a material having a low refractive index are arranged in turn in the plane direction of the substrate and in a direction perpendicular to the plane direction of the substrate. In other words, a plurality of recessed spaces is formed between the plurality of strip protrusions 411 formed on the first structural layer 41, and the second structural layer 42 fills these recessed spaces and forms a flattened surface, to form the first structural layer 41 and the second structural layer 42 in a stacked way.

Figure 5:
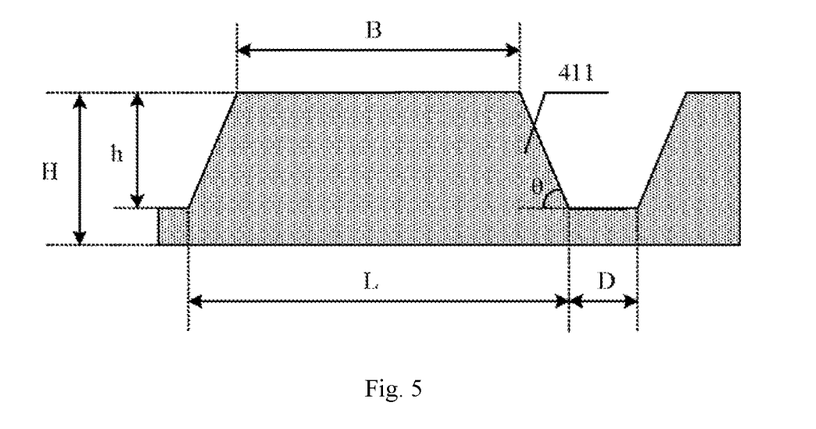
FIG. 5 is a schematic cross-sectional view showing a partial structure of a first structural layer of an OLED display panel according to some embodiments of the present disclosure.
Figure 6:
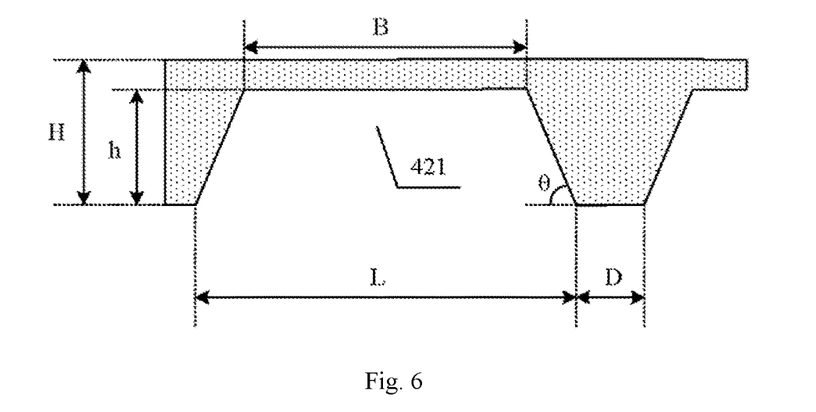
FIG. 6 is a schematic cross-sectional view showing a partial structure of a second structural layer of an OLED display panel according to some embodiments of the present disclosure.

FIG. 5 is a schematic cross-sectional view showing a partial structure of a first structural layer of an OLED display panel according to some embodiments of the present disclosure. FIG. 6 is a schematic cross-sectional view showing a partial structure of a second structural layer of an OLED display panel according to some embodiments of the present disclosure, in which the cross section is a plane perpendicular to the substrate and parallel to the length direction of the substrate. As shown in FIG. 5, the thickness of the first structural layer is H, and the strip protrusions 411 provided thereon has a shape of an isosceles trapezoid in the cross section, of which the lower side is L, the upper side is B, the height is h, the angle (slope angle) between the lateral side and the lower side is θ, and the pitch between adjacent strip protrusions 411 is D. As shown in FIG. 6, the thickness of the second structural layer is H, and the strip grooves 421 provided thereon has a shape of an isosceles trapezoid in the cross section, of which the lower side is L, the upper side is B, the height is h, the slope angle of the lateral side is θ, and the pitch between adjacent strip protrusions 411 is D. That is, the cross section of the strip protrusion 411 and the cross section of the strip groove 421 are the same in shape and geometrical parameters. In one example, the height h of the strip protrusion is equal to the thickness H of the first structural layer, and the height h of the strip groove is equal to the thickness H of the second structural layer, that is, the light modulation layer is formed by sequentially jointing a strip of a high refractive index material and a strip of a low refractive index material.

Figure 7:
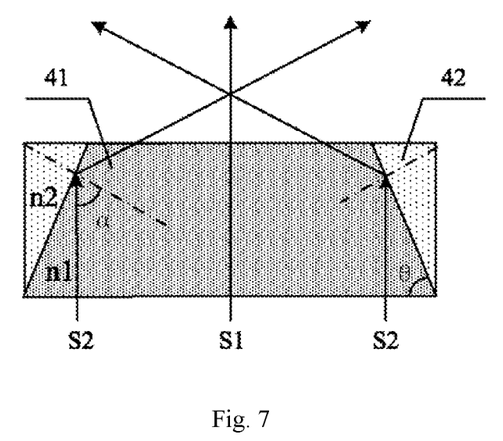
FIGS. 7 and 8 are schematic views showing the working principle of a light modulation layer of an OLED display panel according to some embodiments of the present disclosure.
Figure 8:
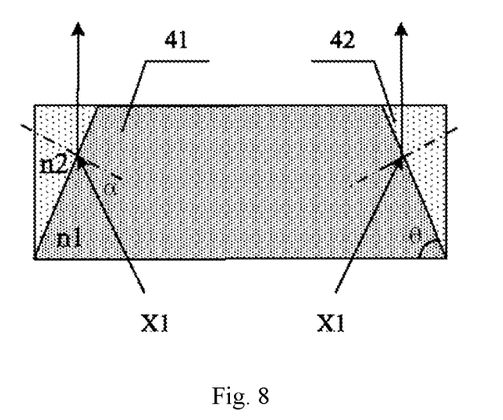

FIGS. 7 and 8 are schematic views showing the working principle of a light modulation layer of an OLED display panel according to some embodiments of the present disclosure, in which the height h of the strip protrusion (groove) is equal to the thickness H of the first (second) structure layer. As shown in FIG. 7, after the front viewing-angle emergent light beam emitted by the light-emitting unit is incident into the first structural layer 41, the light S1 incident on the upper side of the trapezoid directly exits and is still the front viewing-angle emergent light beam. The light S2 incident on the lateral side of the trapezoid is totally reflected, and the total reflected light is reflected back into the first structural layer 41. When the thickness H of the second structural layer is greater than the height h of the cross-section trapezoid, the total reflected light reflected back into the first structural layer 41 is incident into the second structural layer 42 and exits from the second structural layer 42, to form a large viewing-angle emergent light beam. As shown in FIG. 8, after the large viewing-angle emergent light beam emitted by the light-emitting unit is incident into the first structural layer 41, the light X1 incident on the lateral side of trapezoid is refracted, and the refracted light is emitted through the second structural layer 42, to form a front viewing-angle emergent light beam. In this embodiment, a viewing angle is an angle between a normal direction of a display plane and a line of sight, the front viewing-angle emergent light beam is an emergent light beam having a viewing-angle in the range of 0° to 15°, and the large viewing-angle emergent light beam is an emergent light beam having a viewing-angle greater than 40°.

According to optical principles, when light is incident from a large refractive index material into a small refractive index material, if the incident angle α of the incident light exceeds the critical angle $α_0$, the incident light will be totally reflected at the material interface; and if the incident angle α of the incident light does not exceed the critical angle $α_0$, a refraction will occur. The relationship between the critical angle $\alpha_0$ and the refractive index is: sin $\alpha_0$=n2/n1. In this embodiment, the first refractive index n1 of the first structural layer 41 is set to be greater than or equal to 1.8, the second refractive index n2 of the second structural layer 42 is set to be less than or equal to 1.5, and the slope angle θ of the lateral side of the trapezoid is set to be 55°≤θ≤90°. Thus, it is possible to totally reflect the front viewing-angle emergent light beam incident on the lateral side of the trapezoid, and refract the large viewing-angle emergent light beam incident on the lateral side of the trapezoid. In one example, the slope angle θ of the lateral side of trapezoid is: 65°≤θ≤80°. In an example, during the implementation, the material of the first structural layer may include at least one of or a combination of zirconium oxide, titanium oxide, high refractive index resin material, etc., and the material of the second structural layer may be at least one of or a combination of silicon oxide, silicon nitride, fluoropolymer, etc.

In this embodiment, a part of the front viewing-angle emergent light beam is changed into a large viewing-angle emergent light beam by total reflection, which increases the large viewing-angle emergent light beam, reduces the front viewing-angle emergent light beam, and is capable of effectively eliminating the difference between the brightness of the front viewing angle and the brightness of the large viewing angle. Given that the microcavity structure is selective for wavelength, the front viewing-angle emergent light beam and the large viewing-angle emergent light beam have different wavelength ranges. In this embodiment, a part of the front viewing-angle emergent light beam is changed into a large viewing-angle emergent light beam by total reflection, meanwhile a part of the large viewing-angle emergent light beam is changed into the front viewing-angle emergent light beam by refraction, which not only increases the wavelength range of the large viewing-angle emergent light beam, but also increases the wavelength range of the front viewing-angle emergent light beam, thereby effectively eliminating the difference between the chromaticity of the front viewing angle and the chromaticity of the large viewing angle. In other words, in this embodiment, the brightness of the large viewing angle is compensated by the brightness of the front viewing angle, and the difference in chromaticity is eliminated by the complementary of the chromaticity of the front viewing angle and the chromaticity of the large viewing angle. In view of this, in this embodiment, the light modulation structure is formed by arranging the high refractive index material and the low refractive index material in turn, and the front viewing-angle emergent light beam and the large viewing-angle emergent light beam are redistributed by adjusting the direction of the emergent light beam, thereby realizing the balance of the brightness and chromaticity between the front viewing angle and the large viewing angle, effectively solves the problem of the characteristic deviation of viewing angle in the related art, and improves display quality.

The method for preparing the OLED display panel according to some embodiments of the present disclosure is described below. The "patterning process" in this embodiment includes processes such as depositing a film layer, coating a photoresist, exposing a mask, development, etching, stripping a photoresist, etc., and is a mature preparation process in the related art. The deposition may be carried out by a known process such as sputtering, chemical vapor deposition, etc. The coating may be carried out by a known coating process. The etching may be carried out by a known method, which is not specifically limited herein.

(1) First, a pattern of the substrate 10 is prepared. The substrate 10 includes a plurality of gate lines and a plurality of data lines. The plurality of gate lines and the plurality of data lines perpendicularly intersect to form a plurality of matrix-arranged pixel units, in which each of the pixel units includes at least three or four sub-pixels, and each of the sub-pixels includes a thin film transistor (TFT). Generally, one pixel unit includes three sub-pixels: a red sub-pixel R, a green sub-pixel G, and a blue sub-pixel B. One pixel unit may also include four sub-pixels: a red sub-pixel R, a green sub-pixel G, a blue sub-pixel B and a white sub-pixel W. For example, the preparation process may include: cleaning a base; preparing an active layer on the base by a patterning process; forming a first insulating layer covering the active layer; forming a gate line and a gate electrode on the first insulating layer; forming a second insulating layer covering the gate line and the gate electrode; forming a data line, a source electrode and a drain electrode on the second insulating layer; and forming an overcoat covering the data line, the source electrode and the drain electrode. The thin film transistor may be of a bottom gate structure or a top gate structure; and may be an amorphous silicon (a-Si) thin film transistor or a low temperature polysilicon (LTPS) thin film transistor or an oxide thin film transistor, which is not specifically limited in this embodiment. In one example, during the implementation, the base may be made of glass, quartz, polyolefin resin, polyethylene naphthalate-based resin, polyimide-based resin, polyphthalic plastic, phenol resin, or other high light transmissive materials; or a surface-treated polymer soft film, etc. Subsequently, a pattern of the light-emitting structure layer 20 is formed on the base on which the pattern of the substrate 10 is formed. For example, a first electrode is formed on a base on which the above-mentioned pattern is formed, and the first electrode is connected to a drain electrode of the thin film transistor through a via hole. Then, a pixel definition layer is formed which is arranged to define a light-emitting region in each sub-pixel, in which the light-emitting region exposes the first electrode. Subsequently, an organic electroluminescent layer is formed in the light-emitting region, and then a second electrode is formed. As for the top emitting OLED of the embodiment, the first electrode is a reflective electrode, and the second electrode is a transmissive electrode or a transflective electrode, in which a material having a lower work function, such as magnesium Mg, silver Ag, aluminum Al or alloy, is used. The organic electroluminescent layer mainly includes an organic light-emitting layer (EML). In one example, the organic electroluminescent layer includes, in addition to the organic light-emitting layer, an electron transport layer (ETL) and a hole transport layer (HTL); and further includes an electron injection layer (EIL), a hole injection layer (HIL), a light extraction layer, etc., in order to improve the efficiency of the injection of electrons and holes into the organic light-emitting layer. The material of the electron transport layer is, for example, an organic compound having a higher excited state energy level or a derivative thereof. The material of the organic light-emitting layer may be an organic small molecule or polymer material. The material of the hole transport layer may be an organic compound having a higher hole mobility and a lower free potential or a derivative thereof, e.g., aromatic amine, carbazole, etc.

Figure 9:
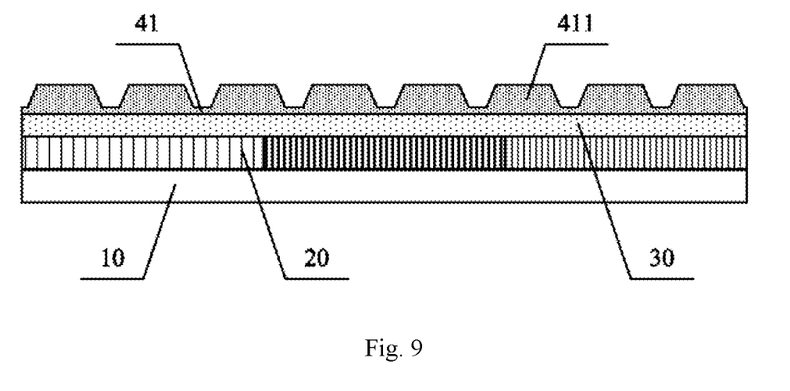
FIG. 9 is a schematic view showing a method for preparing an OLED display panel after a first structural layer pattern is formed according to some embodiments of the present disclosure.
Figure 10:
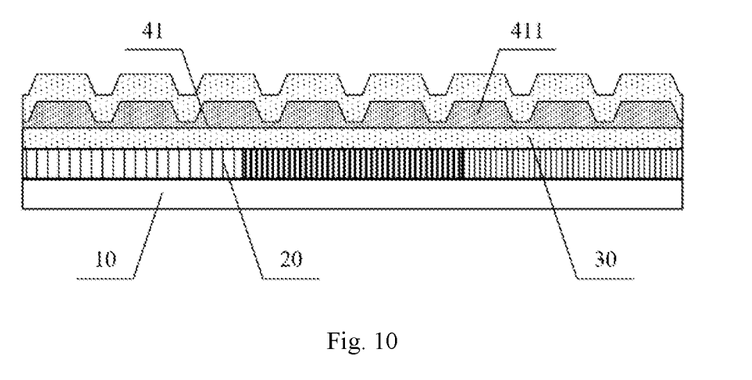
FIG. 10 is a schematic view showing a method for preparing an OLED display panel after a second structural thin film is formed according to some embodiments of the present disclosure.
Figure 11:
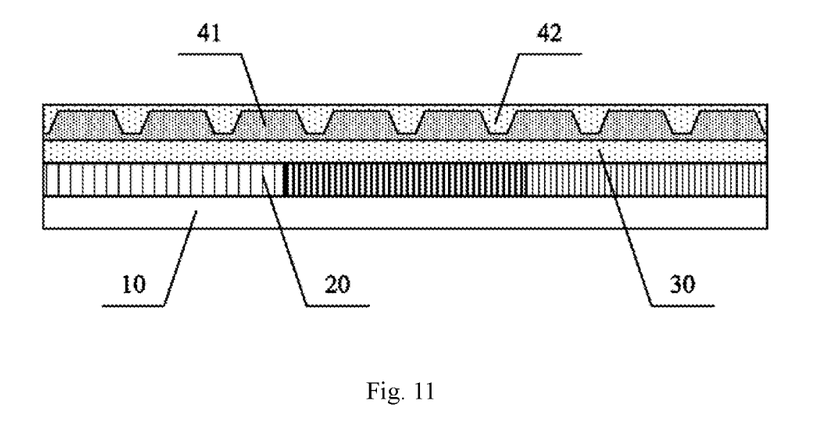
FIG. 11 is a schematic view showing a method for preparing an OLED display panel after a second structural layer pattern is formed according to some embodiments of the present disclosure.

(2) A light modulation layer pattern is formed on the base on which the above-mentioned pattern is formed. The forming the light modulation layer pattern includes: coating a protective layer 30 on the base on which the above-mentioned pattern is formed; depositing the first structural thin film; coating a photoresist on the first structural thin film; exposing and developing the photoresist using a monotone mask, so that an unexposed region is formed at the position of the strip protrusion and the photoresist is reserved, and a completely exposed region is formed at other positions and the photoresist is removed; and the first structural thin film of the completely exposed region is removed by an etching process, to form the first structural layer 41 pattern having a strip projection 411 on its surface, as shown in FIG. 9. The morphology of the lateral side of the trapezoid can be adjusted by selecting an etching gas and controlling the etching rate, etc., and the related process is well known in the art and will not be described herein. Subsequently, a second structural thin film is deposited on the base on which the pattern of the first structural layer 41 is formed, such that the second structural thin film completely fills the space in which the first structural layer 41 is etched, as shown in FIG. 10. Subsequently, the protrusion on the surface of the second structural thin film is removed by a grinding process to planarize the surface thereof, to form a pattern of the second structural layer 42. That is, the second structural layer 42 having a plurality of strip grooves arranged in sequence on its lower surface is snapped onto the upper surface of the first structural layer 41, thereby finally forming a light modulation layer pattern, as shown in FIG. 11. In one example, during the implementation, when the second structural thin film is made of an organic material, the second structural layer pattern with a flattened surface may be directly formed by a coating method, and the second structural layer completely fills the space between the strip projection of the first structural layers.

(3) Finally, a pattern of the packaging layer 50 is formed on the base on which the above-mentioned pattern is formed, and the packaging layer 50 is located on the side of the light modulation layer 40 away from the substrate 10 and may be made of an organic or inorganic material, such as tetrafluoroethylene TFE. The structure of the formed packaging layer pattern and the preparation process are the same as those in the related art, and will not be described herein.

As can be seen from the introduction of the above technical solution and the preparation process thereof, in the OLED display panel provided in this embodiment, a light modulation layer is arranged on the light exiting path of the light-emitting structure layer, in which the light modulation layer has the characteristics of refracting and totally reflecting the emergent light beam, so that a part of the front viewing-angle emergent light beam is changed into a large viewing-angle emergent light beam by total reflection, and a part of the large viewing-angle emergent light beam is changed into a front viewing-angle emergent light beam by refraction, so that the large viewing-angle emergent light beam and the front viewing-angle emergent light beam are redistributed by adjusting the direction of the emergent light beam, thereby achieving the balance of brightness and chromaticity between the front viewing angle and the large viewing angle, effectively solving the problem of the characteristic deviation of viewing angle in the related art, eliminating the characteristic deviation of viewing angle, and improving the display quality. In addition, the preparation of the light modulation layer in the embodiment can be realized by using the mature preparation equipment in the related art. The changing to the process of the related technology is small, the preparation process is simple, the production cost is low, the production precision is high, and the application prospect is promising.

Although this embodiment has been described with a top emitting OLED, the solution of this embodiment is also applicable to a bottom emitting OLED or a double-sided emitting OLED. At the same time, the structure of the OLED display panel may have a lot of variants. For example, when the light modulation layer is made of an inorganic material, the light modulation layer can be directly arranged on the light-emitting structure layer, such that the light modulation layer can simultaneously serve as a protective layer of the light-emitting structure layer. There is no need to set a protective layer in this case. For another example, a structure, in which an packaging layer is arranged on the light-emitting structure layer and a light modulation layer is arranged on the packaging layer, may be used. For yet another example, a structure, in which the light modulation layer is arranged in the packaging layer or the light modulation layer and the packaging layer are arranged in an integrated structure, may be used. For yet another example, when the OLED display panel includes a cover plate, the light-emitting structure layer may be arranged on the substrate to form a light-emitting substrate, the light modulation layer may be arranged on the cover plate to form a light processing substrate, and then the light-emitting substrate and the light processing substrate may form an OLED display panel through a cell alignment. When the light modulation layer is arranged on the cover plate, the influence of the process for preparing the light modulation layer on the light-emitting structure layer can be omitted, and the materials and the process parameters can be widely selected. In addition, the light modulation layer of this embodiment may be of a stacked structure including a plurality of modulation layers sequentially stacked, each of which includes a first structural layer and a second structural layer.

Figure 12:
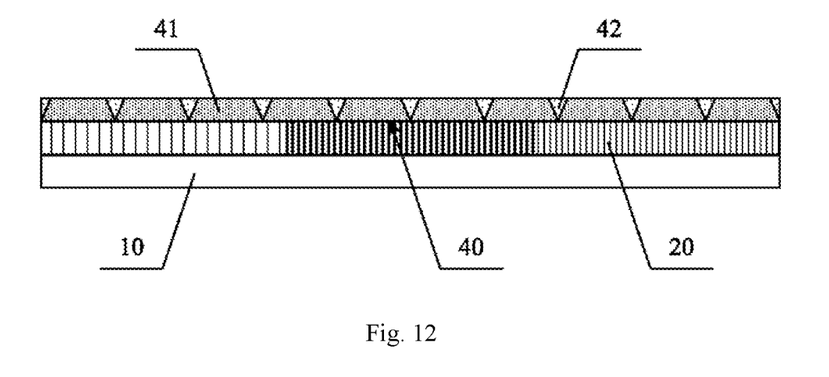
FIG. 12 is a schematic cross-sectional view showing some extended structures of an OLED display panel according to some embodiments of the present disclosure.
Figure 13:
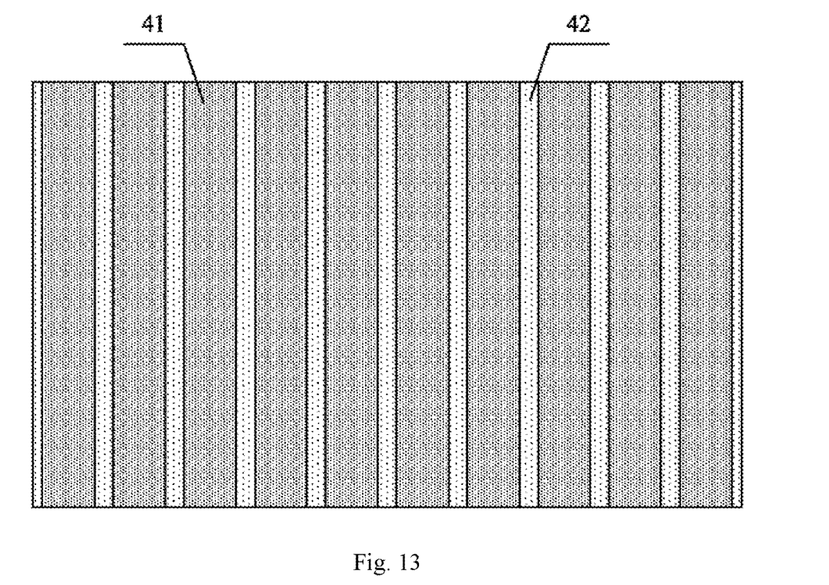
FIG. 13 is a top view of the structure of FIG. 12.

In an example, during implementation, the arrangement of the strip protrusions (grooves), and the lower side L, the upper side B, the height h and the pitch D of the trapezoid can be designed as required, and are not specifically limited herein. Generally, the strip protrusions (grooves) may be arranged in a pixel row or a pixel column, and the positions correspond to a sub-pixel row or a sub-pixel column of the substrate. Although this embodiment has been described by taking the plane shape of the strip protrusions (grooves) being a long strip as an example, according to the technical concept of this embodiment, the plane shape of the strip protrusions (grooves) of this embodiment can also be other shapes, such as curved lines or fold lines. In an example, during implementation, parameters such as the lower side L, the upper side B and the high h of the trapezoid may be set according to the size of the light-emitting unit. Generally, the position of the trapezoid corresponds to the position of the light-emitting unit. As can be seen from the technical concept of the embodiment, the structure of the light modulation layer of this embodiment can be expanded in various ways. For example, in the first (second) structural layer, the pitch D between adjacent strip protrusions (grooves) may be set to D=0. For another example, the height h of the strip projections (grooves) may be set to be equal to the thickness H of the first (second) structural layer. For another example, the trapezoid can be a non-isosceles trapezoid, in which a slope angle of one lateral side is greater than the slope angle of the other lateral side, or the lower side and the upper side of the trapezoid can also be designed as non-parallel shape as required. The brightness and chromaticity of certain viewing angles can be compensated by changing the slope angle as well as the bottom and top sides. FIG. 12 is a schematic cross-sectional view showing some extended structures of an OLED display panel according to some embodiments of the present disclosure. FIG. 13 is a top view of the structure of FIG. 12. As shown in FIGS. 12 and 13, the light-emitting structure layer 20 is arranged on the substrate 10, and the light modulation layer 400 is arranged on the light-emitting structure layer 20, in which the height of the strip protrusions on the first structural layer 41 is equal to the thickness of the first structural layer 41, the height of the strip grooves on the second structural layer 42 is equal to the thickness of the second structural layer 42, and the pitch between adjacent strip protrusions is zero.

The main structure of the OLED display panel provided by other embodiments includes: a substrate 10, a light-emitting structure layer 20 arranged on the substrate 10, a protective layer 30 arranged on the light-emitting structure layer 20, a light modulation layer 40 arranged on the protective layer 30, and an packaging layer 50 located on a side of the light modulation layer 40 away from the substrate, in which the light modulation layer 40 includes a first structural layer 41 and a second structural layer 42 which are stacked. Different from the above-mentioned embodiment, a plurality of block protrusion is provided on the first structural layer 41 of this embodiment, and a plurality of block groove is provided on the second structural layer 42.

Figure 14:
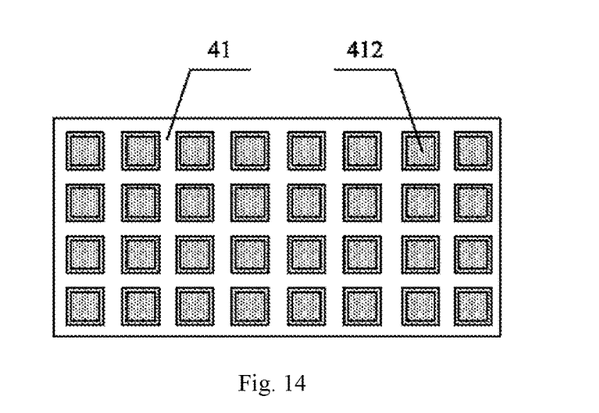
FIG. 14 is a schematic view showing a first structural layer of an OLED display panel according to other embodiments of the present disclosure.
Figure 15:
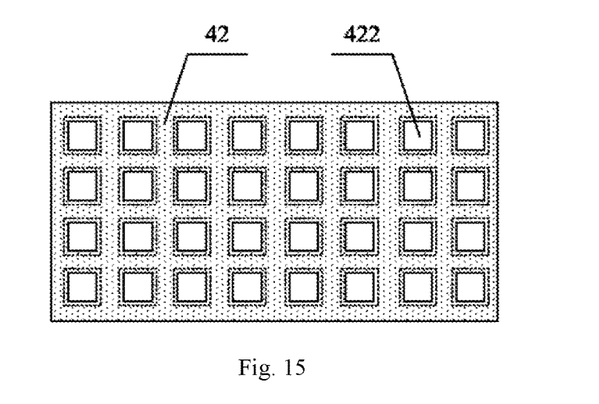
FIG. 15 is a schematic view showing a second structural layer of an OLED display panel according to other embodiments of the present disclosure.

FIG. 14 is a schematic view showing a first structural layer of an OLED display panel according to other embodiments of the present disclosure. FIG. 15 is a schematic view showing a second structural layer of an OLED display panel according to other embodiments of the present disclosure. As shown in FIG. 14, a plurality of block protrusions 412 is provided on the surface of the first structural layer 41 facing the second structural layer 42, in which the plurality of block protrusions 412 is regularly arranged in a matrix manner. As shown in FIG. 15, a plurality of block grooves 422 is provided on the surface of the second structural layer 42 facing the first structural layer 41, in which the plurality of block grooves 422 is regularly arranged in a matrix manner. The block protrusions 412 and the block grooves 422 are same in the cross-sectional shape in a plane perpendicular to the substrate and parallel to the longitudinal direction of the substrate, are same in their arrangement, the arrangement pitch and the like parameters, so that when the second structural layer 42 is arranged on the first structural layer 41, the plurality of block grooves 422 on the second structural layer 42 may be closely attached or buckled on the plurality of block protrusions 412 on the first structural layer 41, such that each of the high refractive index material of the block protrusions 412 is surrounded by the low refractive index material of the second structural layer 42, thereby forming a light modulation structure in which a high refractive index material and a low refractive index material are arranged in turn in the plane direction of the substrate and in a direction perpendicular to the plane direction of the substrate.

In this embodiment, the refractive indices and materials of the first structural layer and the second structural layer, the cross-sectional shape in a plane perpendicular to the substrate and parallel to the longitudinal direction of the substrate, geometric parameters, the working principle of total reflection and refraction of light, the preparation process of the first structural layer and the second structural layer, and the expansion manner of the structure, etc. are all the same as those of the above-mentioned embodiments, so that this embodiment also achieves the technical effects of redistributing the front viewing-angle emergent light beam and the large viewing-angle emergent light beam by adjusting the direction of the emergent light beam, of effectively solving the problem of the characteristic deviation of viewing angle in the related art, and of improving display quality. In addition, since this embodiment forms a two-dimensional light modulation structure, the characteristic deviation of viewing angle can be eliminated in two dimensions.

In this embodiment, the cross-sectional shape of the block projections (grooves) is a trapezoid in a plane perpendicular to the substrate 10 and parallel to the longitudinal direction of the substrate 10, and the cross-sectional shape of the block projections (grooves) may be a rectangle (including a square) in the plane parallel to the substrate 10, that is, each of the block protrusions (grooves) may be a prismatic shape, or the cross-sectional shape of the block projections (grooves) may be an elliptical shape (including a circular shape) in the plane parallel to the substrate 10, that is, each of the block protrusions (grooves) is a truncated cone shape, or the cross-sectional shape of the block projections (grooves) in the plane parallel to the substrate 10 may be may also be a regular shape such as a polygon. The above shapes can all achieve the technical effects of the present disclosure.

The OLED display panel provided by some other embodiments is an extension of the above-mentioned embodiment, and the main structure of the OLED display panel is the same as that of the above-mentioned embodiments. Different from the above-mentioned embodiment, in the plane perpendicular to the substrate 10 and parallel to the longitudinal direction of the substrate 10, the cross-sectional shape of the strip projections (grooves) or the block projections (grooves) of this embodiment is an extended shape of the trapezoid, which is called a trapezoid-like shape.

Figure 16A:
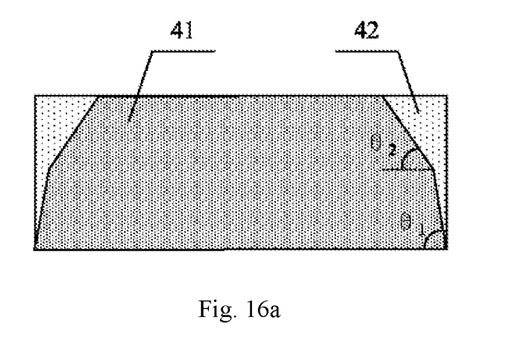
FIGS. 16a to 16d are schematic cross-sectional views showing a first structural layer of an OLED display panel according to still other embodiments of the present disclosure.
Figure 16B:
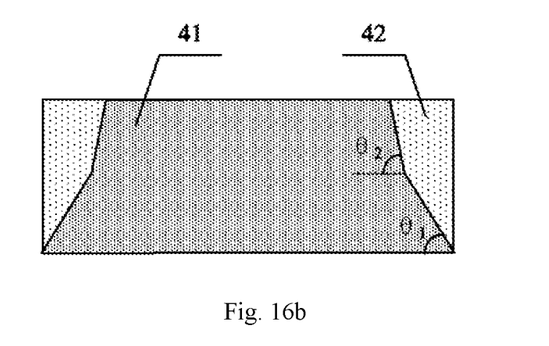

FIGS. 16a to 16d are schematic cross-sectional views showing a first structural layer of an OLED display panel according to still other embodiments of the present disclosure. In a plane perpendicular to the substrate and parallel to the length direction of the substrate, the cross-sectional shape of the strip (block) protrusions of this embodiment is a trapezoid-like shape, in which two lateral sides of the trapezoid-like shape are of a fold line shape, such that the lateral sides of the trapezoid-like shape have at least two slope angles $\theta_1$ and $\theta_2$. In one embodiment, $\theta_1 > \theta_2$, i.e., the fold line has a shape protruding to the outside of the lateral side, as shown in FIG. 16a. In another embodiment, $\theta_1 < \theta_2$, that is, the fold line has a shape recessing toward the inside of the lateral side, as shown in FIG. 16b.

In this embodiment, the cross-sectional shape of the strip (block) protrusions is designed into a trapezoid-like shape, so that not only the technical effects of the above-mentioned embodiments can be achieved, but also the redistribution of the front viewing-angle emergent light beam and the large viewing-angle emergent light beam can be further refined, so that a part of the front viewing-angle emergent light beam incident on the lateral side of the fold line shape is totally reflected, and other part of the front viewing-angle emergent light beam incident on the lateral side of the fold line shape is refracted. For the same reason, it is also possible to control the refraction direction of the large viewing-angle emergent light beam incident onto the lateral side of fold-line shape.

Figure 16C:
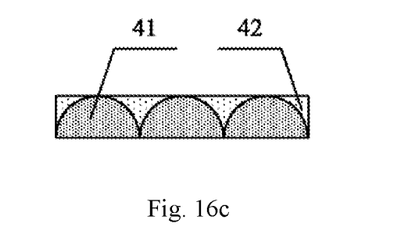
Figure 16D:
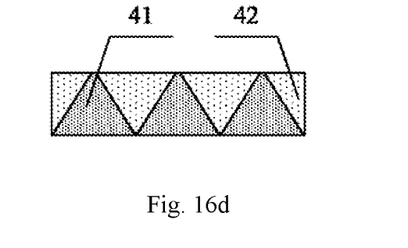

On the basis of the technical concept of the embodiment, the trapezoid-like shape can have many variations. For example, the two lateral sides of the trapezoid-like shape may be of an arc shape, in which the arc shape may protrude toward the outside of the lateral side, or may be recess toward the inside of the lateral side. For another example, as a special evolution of the lateral side being of an arc shape, the upper side of the s trapezoid-like shape is continuously reduced, and the trapezoid-like shape can be evolved into a semicircular or semi-elliptical shape, as shown by FIG. 16c. For another example, as a special evolution of the trapezoid-like shape, the cross-sectional shape can evolve to approximate a rectangle or approximate a triangle, as shown in FIG. 16d. Of course, when the cross-sectional shape is approximately triangular, all of the front viewing-angle emergent light beam emitted from the light-emitting unit is totally reflected; and when the cross-sectional shape is approximately rectangular, all of the large viewing-angle emergent light beam emitted from the light-emitting unit is refracted.

Based on the technical concept of the above-mentioned embodiment, a method for preparing an OLED display panel is further provided in an embodiment of the present disclosure. The method for preparing the OLED display panel of this embodiment includes:

S1: forming a light-emitting structure layer on the substrate; and

S2: forming a light modulation layer on a light exiting path of the light-emitting structure layer, with the light modulation layer being configured to adjust a direction of an emergent light beam.

Step S2 may include forming the light modulation layer on a side of the light-emitting structure layer away from the substrate; or, the method further includes: forming a protective layer on a side of the light-emitting structure layer away from the substrate which is also a side of the light modulation layer proximate to the substrate; or forming a protective layer on a side of the light-emitting structure layer away from the substrate which is also a side of the light modulation layer proximate to the substrate; or forming an packaging layer on a side of the light-emitting structure layer away from the substrate, and the light modulation layer is formed in the packaging layer; or forming a cover plate on a side of the light modulation layer away from the substrate.

Specifically, the forming the light modulation layer includes: depositing a first structural thin film, and forming a first structural layer having a plurality of strip protrusions or block protrusions on a surface thereof by a patterning process; and depositing or coating a second structural thin film on the first structural layer, to form a second structural layer filling a recessed space between the plurality of strip protrusions or a recessed space between the plurality of block protrusions.

A material of the first structural layer may include at least one of zirconium oxide and titanium oxide, and may have a first refractive index greater than or equal to 1.8; and a material of the second structural layer may include at least one of silicon oxide, silicon nitride and fluoropolymer, and may have a second refractive index less than or equal to 1.5.

The cross-sectional shape of the strip protrusion or the block protrusion may be trapezoidal in a plane perpendicular to the substrate and parallel to the length direction of the substrate, in which an angle $\theta$ between the lateral side and the lower side of the trapezoid is greater than or equal to 55° and less than or equal to 90°, a height of the trapezoid is equal to the thickness of the first structural layer or the second structural layer, and a pitch between the strip protrusions or the block protrusions is zero.

The lateral side of the trapezoid may be linear, curved or arcuate.

The step S1 may include forming a first light-emitting unit, a second light-emitting unit, and a third light-emitting unit periodically arranged on the substrate.

The structure, material and related parameters of the light-emitting structure layer and the light modulation layer and the detailed preparation process thereof have been described in detail in the above-mentioned embodiments, and are not described herein again.

In the method for preparing an OLED display panel provided by this embodiment, a light modulation layer is arranged on the light exiting path of the light-emitting structure layer, in which the light modulation layer has the characteristics of refracting and totally reflecting the emergent light beam, so that a part of the front viewing-angle emergent light beam is changed into a large viewing-angle emergent light beam by total reflection, and a part of the large viewing-angle emergent light beam is changed into a front viewing-angle emergent light beam by refraction, so that the large viewing-angle emergent light beam and the front viewing-angle emergent light beam are redistributed by adjusting the direction of the emergent light beam, thereby achieving the balance of brightness and chromaticity between the front viewing angle and the large viewing angle, effectively solving the problem of the characteristic deviation of viewing angle in the related art, eliminating the characteristic deviation of viewing angle, and improving the display quality. The method for preparing the OLED display panel of this embodiment can be realized by using the mature preparation equipment in the related art. The changing to the process of the related technology is small, the preparation process is simple, the production cost is low, the production precision is high, and the application prospect is promising.

Based on the technical concept of the above-mentioned embodiments, a display device including the OLED display panel provided in the above-mentioned embodiment is also provided in an embodiment of the present disclosure. The OLED display device may be any one of a display panel, a mobile phone, a tablet computer, a television, a notebook computer, a digital photo frame, a navigator, or any product or component having a display function.

In the description of the present invention, it should be noted that the terms "middle", "up", "down", "front", "front", "vertical", "horizontal", "top", "bottom", "inside", "outside", etc. indicating the orientation or spatial relationship is based on the orientation or spatial relationship shown in the drawings, and are merely for the convenience of describing the present invention and the simplification of the description, rather than indicating or implying that the referred device or element must have a particular orientation, or be constructed and operated in a particular orientation. Thus, those terms should not be construed as a limitation on the present invention.

In the description of the embodiment of the present disclosure, it should be noted that, unless expressly stated or limited otherwise, the terms "mount", "connect" or "join" shall be interpreted broadly, and may be, for example, fixed connection, removable connection, or integral connection; may be a mechanical connection, may also be an electrical connection; may be direct connection, or may be indirect connection through an intermediary medium, and may be the internal communication of two components. Those skilled in the art would understand the specific meanings of the above terms in the present disclosure according to specific circumstances.

It should be understood that the implementation of any of the products or methods of the present disclosure does not necessarily achieve all of the above-mentioned advantages at the same time. The various features and advantages of the present disclosure are illustrated in the embodiments in the specification, and a part of the features and advantages will be apparent from the embodiments in the specification or be learned by implementing embodiments of the disclosure. The objectives and other advantages of the present disclosure can be realized and obtained by the structure particularly set forth in specification, drawings, and claims.

The embodiments disclosed in the present disclosure are as described above, but they are merely used to facilitate the understanding of the embodiments of the present disclosure, and are not intended to limit the embodiments of the present disclosure. Any modification and variation in the form and details of the embodiments may be made by a person skilled in the art without departing from the spirit and scope of the embodiments of the present disclosure. The scope of patent protection is still subject to the scope defined by the appended claims.

What is claimed is:

1. An organic light-emitting diode (OLED) display panel, comprising a substrate, a light-emitting structure layer arranged on the substrate, and a light modulation layer arranged on a light exiting path of the light-emitting structure layer and configured to adjust a direction of an emergent light beam, wherein the light modulation layer is configured to totally reflect a part of a front viewing-angle emergent light beam from the light-emitting structure layer to change it into a large viewing-angle emergent light beam, and/or to refract a part of a large viewing-angle emergent light beam from the light-emitting structure layer to change it into a front viewing-angle emergent light beam, wherein the light modulation layer comprises a first structural layer and a second structural layer which are stacked, with the first structural layer having a first refractive index, and the second structural layer having a second refractive index less than the first refractive index, wherein a plurality of strip protrusions is provided on a surface of the first structural layer facing the second structural layer; and a plurality of strip grooves is provided on a surface of the second structural layer facing the first structural layer, with the plurality of strip grooves on the second structural layer being attached to the plurality of strip protrusions on the first structural layer; and/or wherein a plurality of block protrusions is provided on a surface of the first structural layer facing the second structural layer; and a plurality of block grooves is provided on a surface of the second structural layer facing the first structural layer, with the plurality of block grooves on the second structural layer being attached to the plurality of block protrusions on the first structural layer, wherein the first structural layer and the plurality of strip protrusions or the plurality of block protrusions are integral and made of a same material, and the second structural layer and the protrusions defining each of the plurality of strip grooves or the plurality of block grooves are integral and made of a same material, wherein the plurality of strip protrusions and the plurality of strip grooves have a trapezoid-like shape in a cross section perpendicular to the substrate, the plurality of block protrusions and the plurality of block grooves have a trapezoid-like shape in a cross section perpendicular to the substrate, and two lateral sides of the trapezoid-like shape are of a fold line shape such that the lateral sides of the trapezoid-like shape have at least two slope angles, wherein a thickness of the first structural layer in a direction perpendicular to the substrate is greater than a thickness of the strip protrusions or the block protrusions in a direction perpendicular to the substrate, and a thickness of the second structural layer in a direction perpendicular to the substrate is greater than a depth of the strip grooves or the block grooves in a direction perpendicular to the substrate, and wherein the light-emitting structure layer comprises a plurality of light-emitting units, each of the plurality of light-emitting units overlap with a plurality orthographic projections of the plurality of strip protrusions or the plurality of block protrusions on the light-emitting structure layer.

2. The OLED display panel of claim 1, wherein the first structural layer consists of one first plane layer and the plurality of strip protrusions, the second structural layer consists of one second plane layer and the plurality of strip grooves, a thickness of the strip protrusions in a direction perpendicular to the substrate is greater than a thickness of the first plane layer in a direction perpendicular to the substrate, and a thickness of the strip grooves in a direction perpendicular to the substrate is greater than a thickness of the second plane layer in a direction perpendicular to the substrate.

3. The OLED display panel of claim 1, wherein orthographic projections of both the block protrusions and the block grooves on the substrate are rectangular.

4. The OLED display panel of claim 1, wherein the strip protrusions and the strip grooves have a trapezoid shape in the cross section perpendicular to the substrate.

5. The OLED display panel of claim 1, wherein the front viewing-angle emergent light beam and the large viewing-angle emergent light beam are redistributed, a viewing angle is an angle between a normal direction of a display plane and a line of sight, the front viewing-angle emergent light beam is an emergent light beam having a viewing-angle in the range of 0° to 15°, and the large viewing-angle emergent light beam is an emergent light beam having a viewing-angle greater than 40°.

6. The OLED display panel of claim 1, wherein the light modulation layer is located on a side of the light-emitting structure layer away from the substrate.

7. The OLED display panel of claim 6, further comprising:
a protective layer arranged on a side of the light-emitting structure layer away from the substrate which is also a side of the light modulation layer proximate to the substrate; and
a packaging layer arranged on a side of the light-emitting structure layer away from the substrate.

8. The OLED display panel of claim 1, wherein a material of the first structural layer comprises at least one of zirconium oxide and titanium oxide, with the first refractive index being greater than or equal to 1.8; and a material of the second structural layer comprises at least one of silicon oxide, silicon nitride and fluoropolymer, with the second refractive index being less than or equal to 1.5.

9. The OLED display panel of claim 1, wherein the light-emitting structure layer comprises a first light-emitting unit, a second light-emitting unit, and a third light-emitting unit periodically arranged on the substrate.

10. A display device comprising the OLED display panel of claim 1.

11. The display device of claim 10, wherein the first structural layer consists of one first plane layer and the plurality of strip protrusions, the second structural layer consists of one second plane layer and the plurality of strip grooves, a thickness of the strip protrusions in a direction perpendicular to the substrate is greater than a thickness of the first plane layer in a direction perpendicular to the substrate, and a thickness of the strip grooves in a direction perpendicular to the substrate is greater than a thickness of the second plane layer in a direction perpendicular to the substrate.

12. The display device of claim 10, wherein orthographic projections of both the block protrusions and the block grooves on the substrate are rectangular.

13. The display device of claim 10, wherein the strip protrusions and the strip grooves have a trapezoid shape.

14. A method for preparing an OLED display panel of claim 1, comprising:
   forming the light-emitting structure layer on the substrate; and
   forming the light modulation layer on a light exiting path of the light-emitting structure layer.

15. The method of claim 14, wherein the light modulation layer is formed on a side of the light-emitting structure layer away from the substrate, and the method further comprises:
   forming a protective layer on a side of the light-emitting structure layer away from the substrate which is also a side of the light modulation layer proximate to the substrate; and
   forming a packaging layer on a side of the light-emitting structure layer away from the substrate.

16. The method of claim 14, wherein the forming the light modulation layer comprises:
   depositing a first structural thin film, and forming the first structural layer having a plurality of strip protrusions or block protrusions on a surface thereof by a patterning process; and
   depositing or coating a second structural thin film on the first structural layer, to form the second structural layer filling a recessed space between the plurality of strip protrusions or a recessed space between the plurality of block protrusions.

17. The method of claim 14, wherein a material of the first structural layer comprises at least one of zirconium oxide and titanium oxide, and has a first refractive index greater than or equal to 1.8; and a material of the second structural layer comprises at least one of silicon oxide, silicon nitride and fluoropolymer, and has a second refractive index less than or equal to 1.5.

18. An organic light-emitting diode (OLED) display panel, comprising:
   a substrate;
   a light-emitting structure layer arranged on the substrate; and
   a light modulation layer arranged on a light exiting path of the light-emitting structure layer and configured to adjust a direction of an emergent light beam,
   wherein the light modulation layer is configured to totally reflect a part of a front viewing-angle emergent light beam from the light-emitting structure layer to change it into a large viewing-angle emergent light beam, and/or to refract a part of a large viewing-angle emergent light beam from the light-emitting structure layer to change it into a front viewing-angle emergent light beam,
   wherein the light modulation layer comprises a first structural layer and a second structural layer which are stacked, with the first structural layer having a first refractive index, and the second structural layer having a second refractive index less than the first refractive index,
   wherein a plurality of strip protrusions is provided on a surface of the first structural layer facing the second structural layer; and a plurality of strip grooves is provided on a surface of the second structural layer facing the first structural layer, with the plurality of strip grooves on the second structural layer being attached to the plurality of strip protrusions on the first structural layer; and/or wherein a plurality of block protrusions is provided on a surface of the first structural layer facing the second structural layer; and a plurality of block grooves is provided on a surface of the second structural layer facing the first structural layer, with the plurality of block grooves on the second structural layer being attached to the plurality of block protrusions on the first structural layer,
   wherein the first structural layer and the plurality of strip protrusions or the plurality of block protrusions are integral and made of a same material, and the second structural layer and the protrusions defining each of the plurality of strip grooves or the plurality of block grooves are integral and made of a same material,
   wherein the plurality of strip protrusions and the plurality of strip grooves have a trapezoid-like shape in a cross section perpendicular to the substrate, the plurality of block protrusions and the plurality of block grooves have a trapezoid-like shape in a cross section perpendicular to the substrate, and two lateral sides of the trapezoid-like shape are of a fold line shape such that the lateral sides of the trapezoid-like shape have at least two slope angles, and
   wherein the first structural layer is formed by firstly depositing a first structural thin film, and then forming the first structural layer having a plurality of strip protrusions or block protrusions on a surface the first structural thin film by a patterning process, and the second structural layer is formed by firstly depositing or coating a second structural thin film on the first structural layer so that the second structural thin film fills a recessed space between the plurality of strip protrusions or a recessed space between the plurality of block protrusions.

19. The OLED display panel of claim 18, wherein the first structural layer consists of one first plane layer and the plurality of strip protrusions, the second structural layer consists of one second plane layer and the plurality of strip grooves, a thickness of the strip protrusions in a direction perpendicular to the substrate is greater than a thickness of the first plane layer in a direction perpendicular to the substrate, and a thickness of the strip grooves in a direction perpendicular to the substrate is greater than a thickness of the second plane layer in a direction perpendicular to the substrate.

20. The OLED display panel of claim 18, wherein orthographic projections of both the block protrusions and the block grooves on the substrate are rectangular.

* * * * *